(12) United States Patent
Maekawa

(10) Patent No.: US 7,479,446 B2
(45) Date of Patent: Jan. 20, 2009

(54) SEMICONDUCTOR DEVICE AND METHOD OF MANUFACTURING SAME

(75) Inventor: Kazuyoshi Maekawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/936,138

(22) Filed: Nov. 7, 2007

(65) Prior Publication Data
US 2008/0064196 A1    Mar. 13, 2008

Related U.S. Application Data

(60) Continuation of application No. 11/266,213, filed on Nov. 4, 2005, now Pat. No. 7,371,681, which is a division of application No. 10/456,529, filed on Jun. 9, 2003, now Pat. No. 6,975,007.

(30) Foreign Application Priority Data

Dec. 11, 2002    (JP) .............................. 2002-359920

(51) Int. Cl.
*H01L 21/3205* (2006.01)
(52) U.S. Cl. ................ 438/592; 438/659; 257/E21.198
(58) Field of Classification Search ................ 438/592, 438/654, 657, 659, 684; 257/E21.198, E21.201
See application file for complete search history.

(56) References Cited

U.S. PATENT DOCUMENTS

| | | | |
|---|---|---|---|
| 5,341,016 A | 8/1994 | Prall et al. | |
| 5,796,166 A | 8/1998 | Agnello et al. | |
| 6,100,188 A | 8/2000 | Lu et al. | |
| 6,187,656 B1 | 2/2001 | Lu et al. | |
| 6,251,780 B1 * | 6/2001 | Sohn et al. | 438/683 |
| 6,291,868 B1 | 9/2001 | Weimer et al. | |
| 6,313,033 B1 | 11/2001 | Chiang et al. | |
| 6,340,629 B1 | 1/2002 | Yeo et al. | |
| 6,465,335 B1 | 10/2002 | Kunikiyo | |
| 6,589,827 B2 | 7/2003 | Kubo et al. | |
| 6,784,116 B2 | 8/2004 | Tanabe et al. | |
| 6,787,864 B2 * | 9/2004 | Paton et al. | 257/412 |
| 2003/0216020 A1 | 11/2003 | Chen et al. | |

FOREIGN PATENT DOCUMENTS

JP    4-225568 A    8/1992

(Continued)

OTHER PUBLICATIONS

C.J. Galewski et al., "Tungsten Gate Structure Formation By Reduced Temperature Conversion of Tungsten Nitride", pp. 513-519, Sunnyvale, CA. no date.

Yasushi Akasaka et al., "Reliable Pretreatment Technology for Hot Process during W Polymetal Gate Formation", *Conference Proceedings*, pp. 521-526, (2000).

*Primary Examiner*—Chandra Chaudhari
(74) *Attorney, Agent, or Firm*—Leydig, Voit & Mayer, Ltd.

(57) ABSTRACT

An electrode on a semiconductor substrate includes a polysilicon layer, a silicon-implanted layer on the polysilicon layer, a tungsten nitride layer on the silicon-implanted layer, a tungsten nitride layer on the silicon-implanted layer, and a tungsten layer on the tungsten nitride layer. The layer between the polysilicon layer and the tungsten nitride layer may be either a tungsten silicon nitride layer or a silicon-germanium layer.

1 Claim, 17 Drawing Sheets

FOREIGN PATENT DOCUMENTS

| | | |
|---|---|---|
| JP | 11-233451 | 8/1999 |
| JP | 2000-188401 | 7/2000 |
| JP | 2001-308322 A | 11/2001 |
| JP | 2001-326348 A | 11/2001 |
| JP | 2002-141500 A | 5/2002 |
| KR | 2002-672334 | 5/2002 |

* cited by examiner

SEMICONDUCTOR DEVICE AND METHOD OF MANUFACTURING SAME

BACKGROUND OF THE INVENTION

1. Field of the Invention

The present invention relates to a semiconductor device and a method of manufacturing the same and more particularly, to a semiconductor device having a polymetal gate structure and a method of manufacturing the device.

2. Background Art

The steps of forming a gate electrode on a semiconductor substrate have been conventionally carried out according to the following procedure (see, for example, Japanese Laid-open Patent Application No. 2002-188401).

Initially, a gate insulating film and a polysilicon layer are successively formed on a semiconductor substrate in which a diffusion layer has been formed, followed by thermal treatment to facilitate the crystallization of the polysilicon layer. Next, a tungsten nitride layer, a tungsten layer and a silicon oxide film are successively formed on the polysilicon layer. The tungsten nitride layer serves as a barrier layer for suppressing the reaction between the polysilicon layer and the tungsten layer. Thereafter, a resist film is formed on the silicon oxide film and patterned by lithography, followed by further patterning of the silicon oxide film through the mask of the resultant resist pattern. Subsequently, using the silicon oxide film pattern as a hard mask, the tungsten layer, tungsten nitride layer, polysilicon layer and gate insulating layer are, respectively, etched. Thereafter, after formation of a silicon oxide film, this film is etched back over the entire surface thereof to form side walls. According to the steps set out hereinabove, a gate electrode is formed on the semiconductor substrate.

However, where a constituent material for the gate electrode is exposed to high heating temperatures (of 950° C. or over, for example) in such gate electrode-forming steps and also in subsequent steps, a problem has arisen in that a high resistance layer, such as a silicon nitride film or silicon oxide film, is formed at the interface between the polysilicon layer and the tungsten nitride layer. The presence of the high resistance layer has made it difficult to permit the good ohmic contact of the gate electrode, with the attendant problem that failures, such as a work failure or delay of a semiconductor device, are caused.

SUMMARY OF THE INVENTION

The present invention is made to solve the above problems, and its object is to provide a semiconductor device having no high resistance layer between a polysilicon layer and a tungsten nitride layer and also a method of manufacturing the device.

Another object of the present invention is to provide a semiconductor device and a method of manufacturing the device, which device having a gate electrode structure ensuring good ohmic contact.

Other objects and features of the present invention will become apparent from the following description.

According to one aspect of the present invention, a semiconductor device comprises an electrode on a semiconductor substrate. The electrode includes a polysilicon layer, an intermediate layer on the polysilicon layer, a tungsten nitride layer on the intermediate layer, and a tungsten layer on the tungsten nitride layer. The intermediate layer is selected from the group consisting of a silicon-injected layer, a tungsten silicon nitride layer and a silicon germanium layer.

According to another aspect of the present invention, a semiconductor device comprises an electrode on a semiconductor substrate. The electrode includes a polysilicon layer, a tungsten silicon nitride layer on the polysilicon layer, and a tungsten layer on the tungsten silicon nitride layer.

According to other aspect of the present invention, in a method of manufacturing a semiconductor device, a gate insulating film is formed on a semiconductor substrate. A polysilicon layer is formed on the gate insulating film. A tungsten nitride layer is formed on the polysilicon layer. The silicon is injected from above the tungsten nitride layer. A tungsten layer is formed on the tungsten nitride layer.

According to other aspect of the present invention, in a method of manufacturing a semiconductor device, a gate insulating film is formed on a semiconductor substrate. A polysilicon layer is formed on the gate insulating film. A tungsten nitride layer is formed on the polysilicon layer at a temperature of 300° C. to 700° C. A tungsten layer is formed on the tungsten nitride layer.

According to other aspect of the present invention, in a method of manufacturing a semiconductor device, a gate insulating film is formed on a semiconductor substrate. A polysilicon layer is formed on the gate insulating film. A silicon germanium layer is formed on the polysilicon layer. A tungsten nitride layer is formed on the silicon germanium layer. A tungsten layer is formed on the tungsten nitride layer.

According to other aspect of the present invention, in a method of manufacturing a semiconductor device, a gate insulating film is formed on a semiconductor substrate. A polysilicon layer is formed on the gate insulating film. A tungsten layer is formed on the polysilicon layer. Thermal treatment is performed to the tungsten layer in a nitrogen or an ammonia gas so that a lower layer in contact with the polysilicon is converted into a tungsten silicon nitride layer and an upper layer is converted into a tungsten nitride layer. A tungsten layer is formed on the tungsten nitride layer.

According to other aspect of the present invention, in a method of manufacturing a semiconductor device, a gate insulating film is formed on a semiconductor substrate. A polysilicon layer is formed on the gate insulating film. A tungsten layer is formed on the polysilicon layer. The germanium is injected from above the tungsten layer to form a germanium-injected layer between the polysilicon layer and the tungsten layer. Thermal treatment is performed to the tungsten layer and the germanium-injected layer in a nitrogen or an ammonia gas so that the tungsten layer is converted into a tungsten nitride layer and the germanium-injected layer is converted into a silicon germanium layer. A tungsten layer is formed on the tungsten nitride layer.

According to other aspect of the present invention, in a method of manufacturing a semiconductor device, a gate insulating film is formed on a semiconductor substrate. A polysilicon layer is formed on the gate insulating film. A tungsten nitride layer is formed on the polysilicon layer. The germanium is injected from above the tungsten nitride layer to form a germanium-injected layer between the polysilicon layer and the tungsten nitride layer. Thermal treatment is performed to the germanium-injected layer to provide a silicon germanium layer. A tungsten layer is formed on the tungsten nitride layer.

Other and further objects, features and advantages of the invention will appear more fully from the following description.

DETAILED DESCRIPTION OF THE PREFERRED EMBODIMENTS

Embodiments of the invention will be described in detail with reference to the accompanying drawings.

First Embodiment

This embodiment is characterized in that a silicon-injected layer is provided as an intermediate layer between a polysilicon layer and a tungsten nitride layer.

With reference to FIGS. 1 to 12, the semiconductor device and its manufacture according to this embodiment are described.

Figure 1:
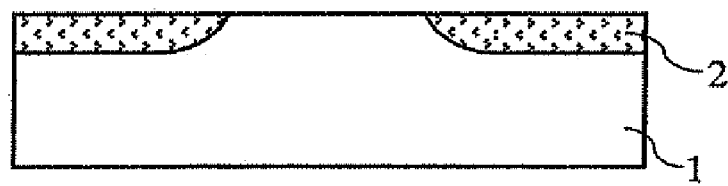
FIG. 1 shows a method of manufacturing a semiconductor device according to the first embodiment.

As shown in FIG. 1, a diffusion layer 2 is formed in a semiconductor substrate 1. The diffusion layer 2 can be formed, for example, by ion implantation of an impurity of high concentration into the surface of the semiconductor substrate 1 using, as a mask, a resist film, silicon oxide film or silicon nitride film. The impurity used may be made, for example, of arsenic (As) for n-type conductivity, and of boron (B) for p-type conductivity. The semiconductor substrate used may be, for example, a silicon substrate.

Figure 2:
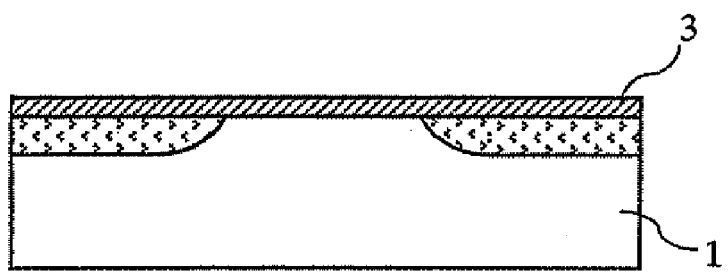
FIG. 2 shows a method of manufacturing a semiconductor device according to the first embodiment.

Next, as shown in FIG. 2, a gate insulating film 3 is formed on the semiconductor substrate 1. A silicon oxide film or silicon nitride film may be used, for example, as the gate insulating film, which can be formed, for example, by a chemical vapor deposition (hereinafter referred to simply as CVD) method or the like.

Figure 3:
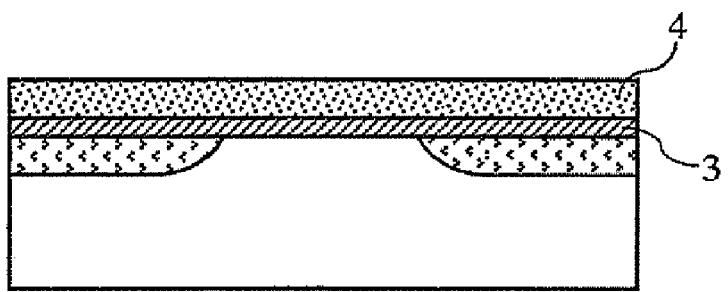
FIG. 3 shows a method of manufacturing a semiconductor device according to the first embodiment.

Next, as shown in FIG. 3, a polysilicon film 4 is formed on the gate insulating film 3 by a CVD method or the like. A doped amorphous silicon layer may be used instead of the polysilicon layer.

Subsequently, in order to enhance the crystallinity of the polysilicon layer, thermal treatment is carried out under appropriate conditions. For instance, thermal treatment at a temperature of about 750° C. is performed. If the doped amorphous silicon layer is formed in place of the polysilicon layer, then the crystal structure is changed from the amorphous silicon layer into a polysilicon layer through this thermal treatment.

Figure 4:
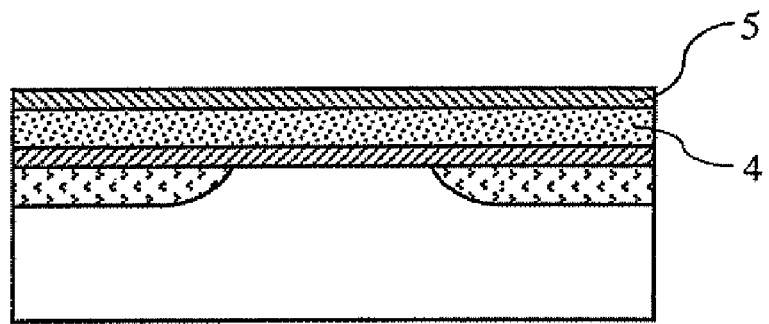
FIG. 4 shows a method of manufacturing a semiconductor device according to the first embodiment.

Next, as shown in FIG. 4, a tungsten nitride (WN) layer 5 is formed on the polysilicon layer 4 by a CVD or sputtering method. The tungsten nitride film serves as a barrier layer for preventing the reaction between the polysilicon layer 4 and a subsequently formed tungsten layer.

Figure 5:
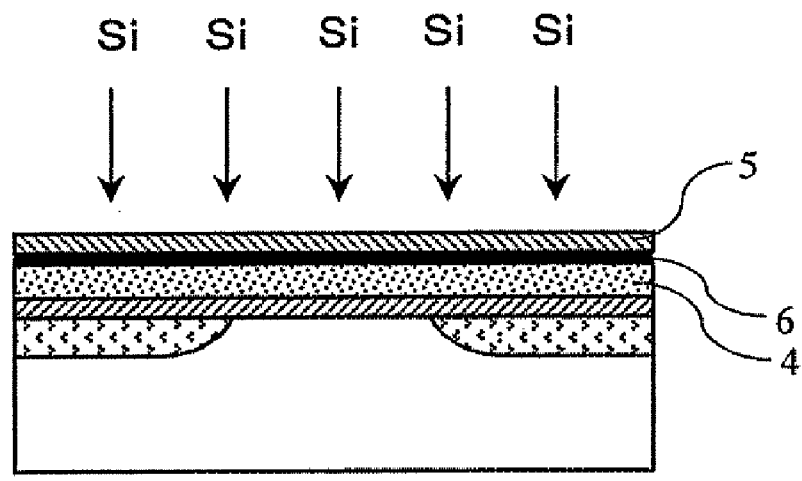
FIG. 5 shows a method of manufacturing a semiconductor device according to the first embodiment.

This embodiment is characterized in that a silicon-injected layer is formed, as an intermediate layer, between the polysilicon layer and the tungsten nitride layer. More particularly, as shown in FIG. 5, after the formation of the tungsten nitride layer 5, silicon (Si) is injected from the surface of the tungsten nitride layer 5 to form a silicon-injected layer 6 between the polysilicon layer 4 and the tungsten nitride layer 5. Silicon may be injected, for example, by an ion implantation method.

Silicon is injected from above the tungsten nitride layer and particularly, from the main surface side of the tungsten nitride layer 5. As shown in FIG. 5, after the formation of the tungsten nitride layer 5, silicon is injected via the tungsten nitride layer 5 from outside, thereby forming the silicon-injected layer 6 between the polysilicon layer 4 and the tungsten nitride layer 5.

The silicon-injected layer 6 may be formed both the polysilicon layer 4 and the tungsten nitride layer 5. The silicon-injected layer 6 may be formed only in the upper part of the polysilicon layer 4. Moreover, the silicon-injected layer 6 may be formed may be formed only in the lower part of the tungsten nitride layer 5. In the embodiment the silicon-injected layer 6 is preferably formed in a boundary zone between the polysilicon layer 4 and the tungsten nitride layer 5.

In this arrangement, the silicon-injected layer 6 acts as a barrier layer, so that the reaction between the polysilicon layer 4 and the tungsten nitride layer 5 is appropriately suppressed. In this condition, when a high heating temperature is applied to the polysilicon layer 4 and the silicon nitride layer 6 during the course of the process, the formation of a high resistance layer between these layers can be prevented.

The silicon-injected layer 6 is made of a conductive film, thus enabling one to form a gate electrode ensuring good ohmic contact.

Figure 6:
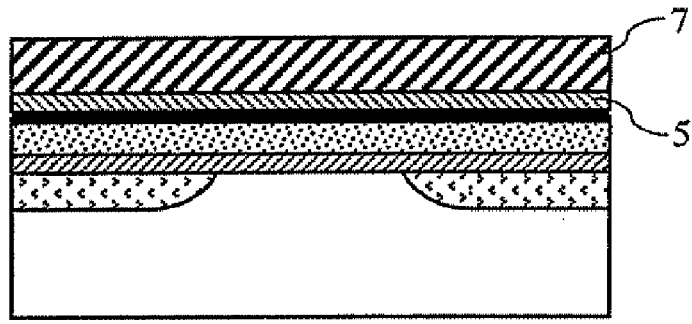
FIG. 6 shows a method of manufacturing a semiconductor device according to the first embodiment.

Next, as shown in FIG. 6, a tungsten (W) layer 7 is formed on the tungsten nitride layer 5 by a CVD method or sputtering method.

Figure 7:
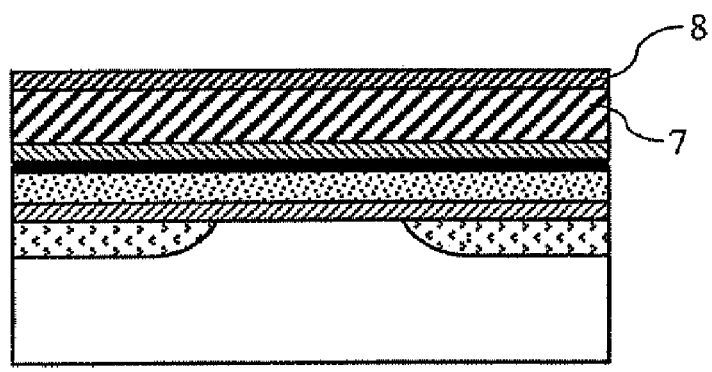
FIG. 7 shows a method of manufacturing a semiconductor device according to the first embodiment.
Figure 8:
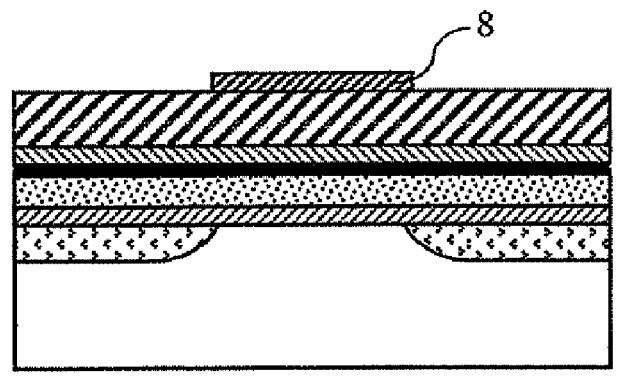
FIG. 8 shows a method of manufacturing a semiconductor device according to the first embodiment.

As shown in FIG. 7, a hard mask 8 is formed on the tungsten layer 7 by a CVD method or the like. For the hard mask, a silicon oxide film, a silicon nitride film or a composite film of silicon oxide and silicon nitride films can be used, for example.

Subsequently, a resist film, not shown, is formed on the hard mask 8, followed by pattering the resist film by a photolithographic method. The resulting resist pattern is used as a mask for etching the hard mask 8 therethrough to provide a structure of FIG. 8.

Figure 9:
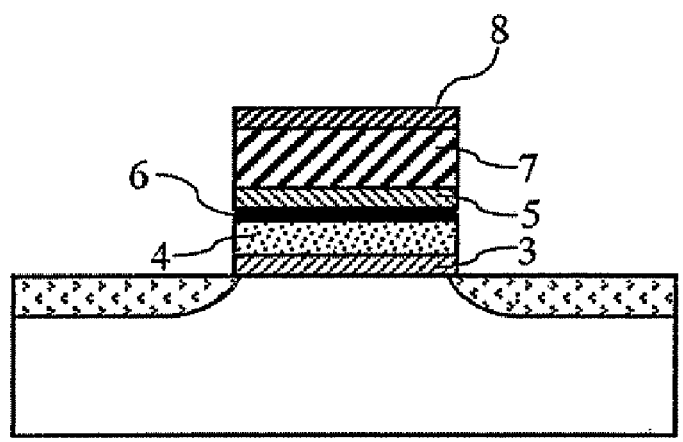
FIG. 9 shows a method of manufacturing a semiconductor device according to the first embodiment.

The thus etched hard mask 8 is used to subject the underlying tungsten layer 7, tungsten nitride layer 5, silicon-injected layer 6, polysilicon layer 4 and the gate insulating film 3 to etching in a desired pattern, thereby providing a structure of FIG. 9.

Figure 10:
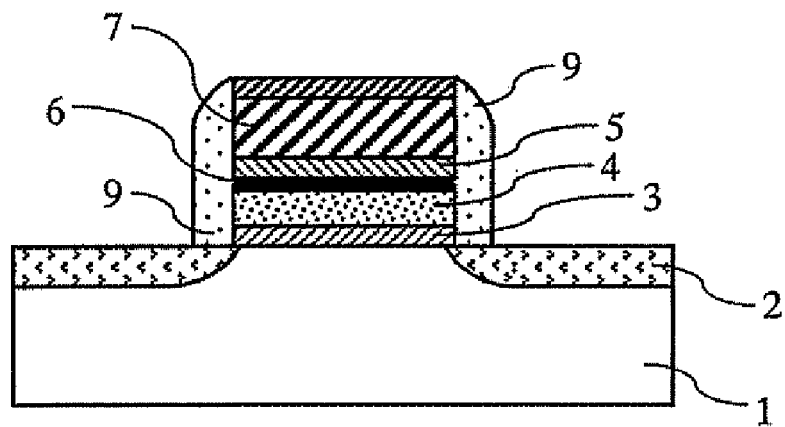
FIG. 10 shows a method of manufacturing a semiconductor device according to the first embodiment.

Finally, a silicon oxide film, a silicon nitride film or a composite film of silicon oxide and silicon nitride films is formed and etched back on the entire surface thereof to form side walls 9 shown in FIG. 10.

According to the steps set out hereinabove, the gate electrode can be formed on the semiconductor substrate. More particularly, this embodiment is characterized in that the gate electrode formed on the semiconductor substrate includes the polysilicon layer, the silicon-injected layer serving as an intermediate layer and formed on the polysilicon layer, the tungsten nitride layer formed on the silicon-injected layer, and the tungsten layer formed on the tungsten nitride layer.

According to the embodiment, since the silicon-injected layer is formed, as an intermediate layer (barrier layer), between the polysilicon layer and the tungsten nitride layer, any high resistance layer is not formed between the polysilicon layer and the tungsten nitride layer upon application of high heating temperatures. Moreover, the silicon-injected layer is conductive in nature, ensuring good ohmic contact.

Figure 11:
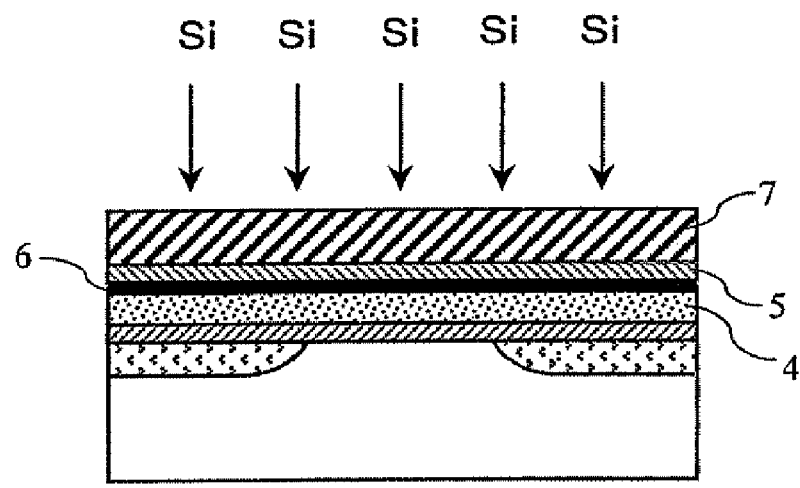
FIG. 11 shows a method of manufacturing a semiconductor device according to the first embodiment.
Figure 12:
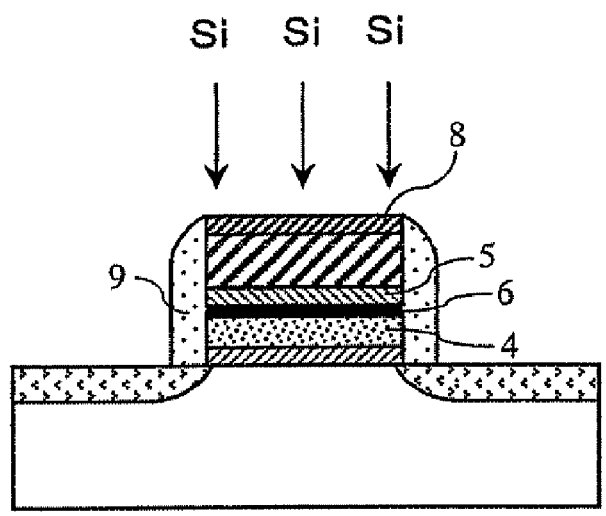
FIG. 12 shows a method of manufacturing a semiconductor device according to the first embodiment.

Although the instance of forming the silicon-injected layer by implantation or injection of silicon after the formation of the tungsten nitride layer has been stated in this embodiment, the invention should not be construed as limiting to this instance. As shown in FIG. 11, after the formation of the tungsten layer 7 on the tungsten nitride layer 5, silicon may be injected from above the tungsten layer, i.e. from the main surface side of the tungsten layer. Moreover, as shown in FIG. 12, after the formation of the side walls 9, silicon may be injected from above the hard mask 8, i.e., from the main surface side of the hard mask 8. According to these methods, the silicon-injected layer 6 can be formed between the polysilicon layer 4 and the tungsten nitride layer 5 to achieve the effect of the invention.

Second Embodiment

This embodiment is characterized in that the layer provided between the polysilicon layer and the tungsten layer is made of a tungsten silicon nitride layer.

Initially, according to the procedures of FIGS. 1 to 4 illustrated with respect to the first embodiment, a semiconductor device is made. More particularly, after the formation of a diffusion layer on a semiconductor substrate, a gate insulating film, a polysilicon layer and a tungsten nitride layer are successively formed on the semiconductor substrate.

The polysilicon layer may be formed by direct formation thereof on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 13:
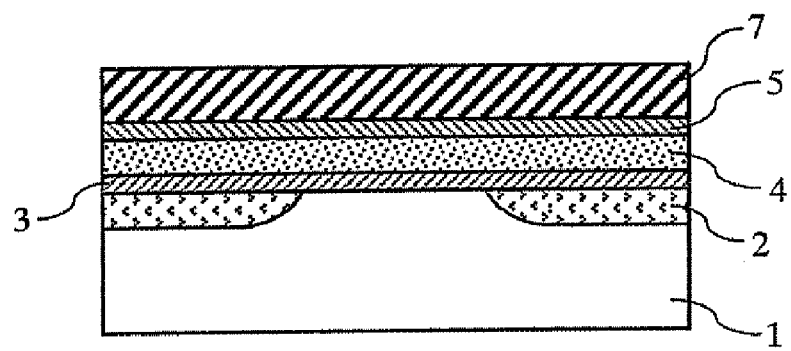
FIG. 13 shows a method of manufacturing a semiconductor device according to the second embodiment.

Next, a tungsten layer is formed on the tungsten nitride layer according to a sputtering or CVD method to provide a structure of FIG. 13. It will be noted that in FIG. 13, films corresponding to those films illustrated in the first embodiment are, respectively, indicated by like reference numerals. More particularly, in FIG. 13, indicated by 1 is a semiconductor substrate, by 2 is a diffusion layer, by 3 is a gate insulating film, by 4 is a polysilicon layer, by 5 is a tungsten nitride layer, and by 7 is a tungsten layer.

Figure 14:
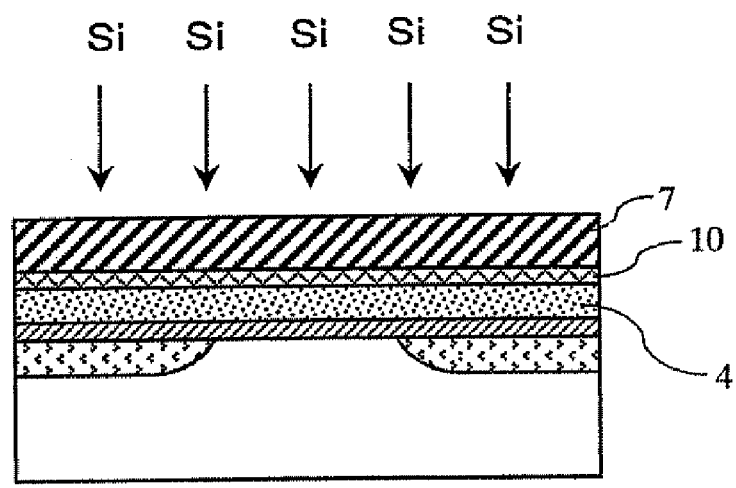
FIG. 14 shows a method of manufacturing a semiconductor device according to the second embodiment.

Next, as shown in FIG. 14, silicon is injected into the tungsten nitride layer from above the tungsten layer 7, thereby converting the tungsten nitride (WN) layer into a tungsten silicon nitride ($W_xSi_yN_z$) layer 10.

In the first embodiment, the silicon-injected layer has been formed between the polysilicon layer and the tungsten nitride layer through implantation of silicon. On the other hand, this embodiment is characterized in that silicon is injected into the tungsten nitride layer from above the tungsten layer to convert the tungsten nitride into the tungsten silicon nitride layer. In other words, this embodiment is so arranged that the silicon-injected from outside is retained within the tungsten nitride layer without passing through the tungsten nitride layer. The injection can be performed, for example, by an ion implantation method and the depth of injection can be controlled depending on the level of injection energy.

In this way, the upper layer on the polysilicon layer can be formed as a tungsten silicon nitride layer, not as a tungsten nitride layer. Accordingly, when high heating temperatures are applied to in the course of the process, no reaction takes place between the polysilicon layer and the tungsten nitride layer, so that any high resistance layer is not formed on the polysilicon layer.

In addition, the tungsten silicon nitride layer is conductive in nature, thereby ensuring the formation of a gate electrode having good ohmic contact.

The tungsten silicon nitride layer serves also as a barrier layer for suppressing the reaction between the lower polysilicon layer and the upper tungsten layer. Thus, if the tungsten nitride layer is changed into the tungsten silicon nitride layer, no reaction occurs between the polysilicon layer and the tungsten layer, thus presenting no problem such as a rise in resistance value of the resultant semiconductor device. It should be noted that from the standpoint of such a barrier property as mentioned above, the tungsten silicon nitride layer in the embodiment is preferably made of an amorphous film.

After having converted the tungsten nitride layer into the tungsten silicon nitride layer according to the steps set out hereinabove, subsequent steps are carried out in the same manner as the procedures shown in FIGS. 7 to 10 illustrated with respect to the first embodiment. More particularly, a hard mask is formed on the tungsten layer and patterned by a photolithographic method. Thereafter, using the resulting hard mask, the underlying tungsten layer, tungsten silicon nitride layer, polysilicon layer and gate insulating film are, respectively, etched in a desired pattern. Finally, a silicon oxide film, a silicon nitride film or a composite film of silicon oxide and silicon nitride films is formed thereover, followed by etching back to form side walls.

According to the steps set forth hereinabove, a gate electrode can be formed on the semiconductor substrate. More particularly, this embodiment is characterized in that the electrode formed on the semiconductor substrate has the polysilicon layer, the tungsten silicon nitride layer formed on the polysilicon layer, and the tungsten layer formed on the tungsten silicon nitride layer.

According to this embodiment, the film on the polysilicon layer is made of the tungsten silicon nitride layer, not the tungsten nitride layer, so that when a high heating temperature is applied to, the polysilicon layer does not react with the upper layer. More particularly, because the polysilicon layer does not react with the tungsten silicon nitride layer, any high resistance layer is not formed therebetween.

According to the embodiment, the tungsten silicon nitride film used is conductive, so that good ohmic contact is ensured.

Further, the tungsten silicon nitride layer formed according to the embodiment acts as a barrier for suppressing the reaction between the polysilicon layer and the tungsten layer, and thus, the resulting semiconductor device does not increase in resistance due to the reaction between the polysilicon layer and the tungsten layer.

Figure 15:
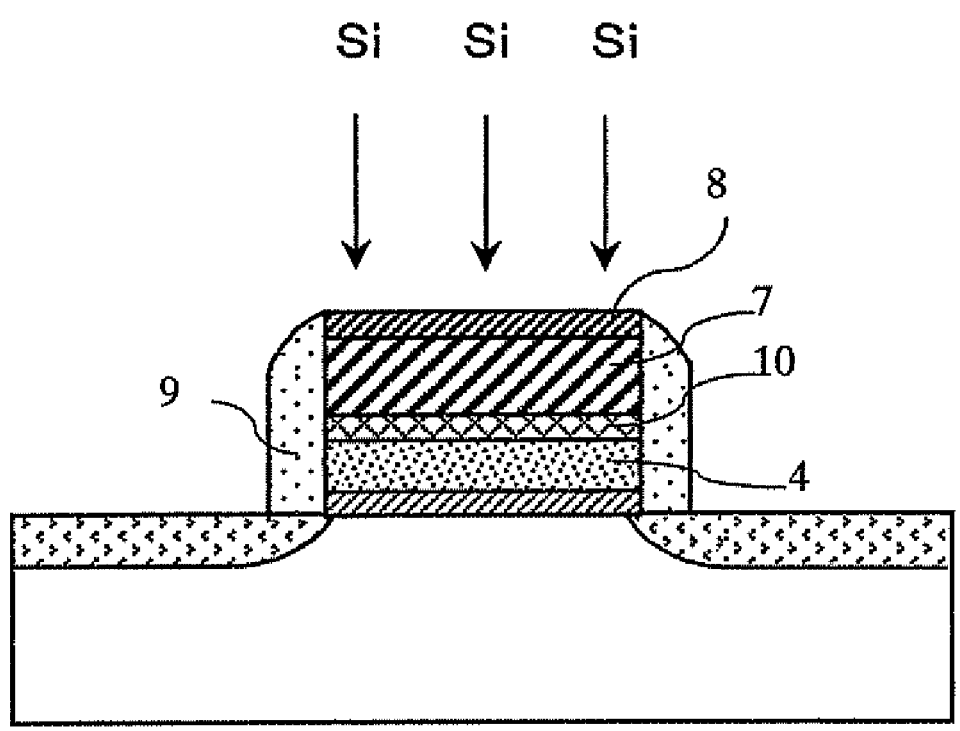
FIG. 15 shows a method of manufacturing a semiconductor device according to the second embodiment.

Although the instance of forming the tungsten silicon nitride layer by injecting silicon from above the tungsten layer after the formation of the tungsten layer has been stated in this embodiment, the invention should not be construed as limiting to this instance. The tungsten nitride layer may be converted into the tungsten silicon nitride layer by injecting silicon from above the tungsten nitride layer after the formation thereof. Alternatively, as shown in FIG. 15, after formation of the side walls 9, silicon may be injected from above the hard mask 8. In this way, the tungsten silicon nitride layer 10 is formed between the polysilicon layer 4 and the tungsten layer 7, thereby enabling the effects of the invention to be obtained.

Third Embodiment

This embodiment is characterized in that a tungsten silicon nitride layer is formed, as an intermediate layer, between a polysilicon layer and a tungsten nitride layer.

A semiconductor device is made according to the procedures of FIGS. 1 to 3 illustrated with respect to the first embodiment. More particularly, a diffusion layer is formed in a semiconductor substrate, after which a gate insulating film and a polysilicon layer are successively formed on the semiconductor substrate.

The polysilicon layer may be formed by directly forming a polysilicon layer on the gate insulating film. In order to enhance the crystallinity of the polysilicon layer, it is preferred to carry out thermal treatment under appropriate conditions (of about 750° C., for example). The polysilicon layer may be formed by forming a doped amorphous silicon layer on the gate insulating film and thermally treating the amorphous silicon layer. More particularly, the amorphous silicon layer is subjected to thermal treatment at a temperature of about 750° C. for conversion of the crystal structure thereof to provide a polysilicon layer.

Figure 16:
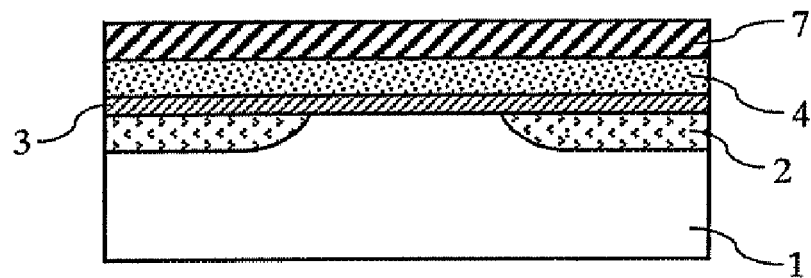
FIG. 16 shows a method of manufacturing a semiconductor device according to the third embodiment.

Next, as shown in FIG. 16, a tungsten layer 7 is formed on the polysilicon layer 4 according to a sputtering or CVD method. This embodiment is characterized in that after the formation of the tungsten layer, thermal treatment is carried out in an atmosphere of nitrogen ($N_2$) or an ammonia ($NH_3$) gas. The temperature of the thermal treatment should preferably be within a range of 600° C. to 1,200° C., more preferably from 800° C. to 1,000° C. It will be noted that in FIG. 16, films corresponding to those films illustrated in the first embodiment are, respectively, indicated by like reference numerals.

Figure 17:
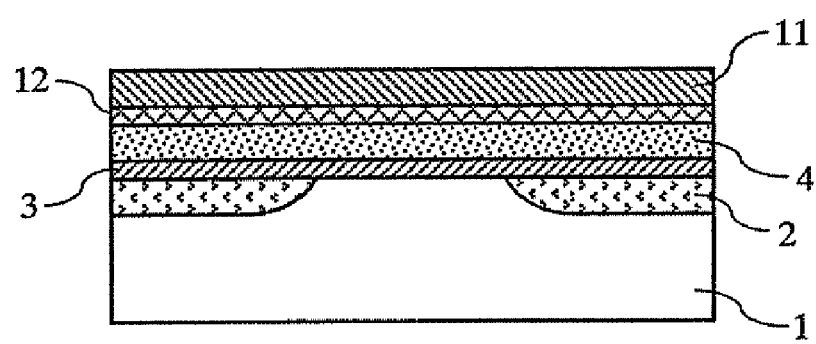
FIG. 17 shows a method of manufacturing a semiconductor device according to the third embodiment.

FIG. 17 is a sectional view of a semiconductor device obtained after the thermal treatment. As shown in the figure, the thermal treatment enables the tungsten (W) layer to be converted into a tungsten nitride (WN) layer 11 and also a tungsten silicon nitride layer ($W_xSi_yN_z$) 12 to be formed in the vicinity of the interface between the tungsten nitride layer 11 and the polysilicon layer 4.

More particularly, the thermal treatment of the tungsten layer in an atmosphere of nitrogen gas or ammonia gas permits the tungsten layer at a lower portion thereof in contact with the polysilicon layer to be converted into the tungsten silicon nitride layer and the upper portion thereof to be converted into the tungsten nitride layer.

According to the arrangement of this embodiment, the tungsten silicon nitride layer serves as a barrier layer, so that when a high heating temperature is applied to the polysilicon layer and the tungsten nitride layer, any high resistance layer is not formed through reaction of these layers.

It will be noted that where the thermal treatment is carried out in an atmosphere of ammonia gas, the thermal treatment may be continuously performed in an atmosphere of nitrogen so as to eliminate residual ammonia.

In this embodiment, it is preferred that after the formation of the tungsten layer, the thermal treatment is carried out continuously without exposing the semiconductor substrate to air. For instance, a multi-chamber is used to form a tungsten layer, followed by transferring to a thermal treating apparatus in vacuum or in an atmosphere of an inert gas. In this way, the tungsten layer is prevented from exposure to air on the surface thereof. Accordingly, any oxide film is not formed on the surface of the tungsten layer, so that the increase in resistance of the resulting semiconductor device can be prevented.

Figure 18:
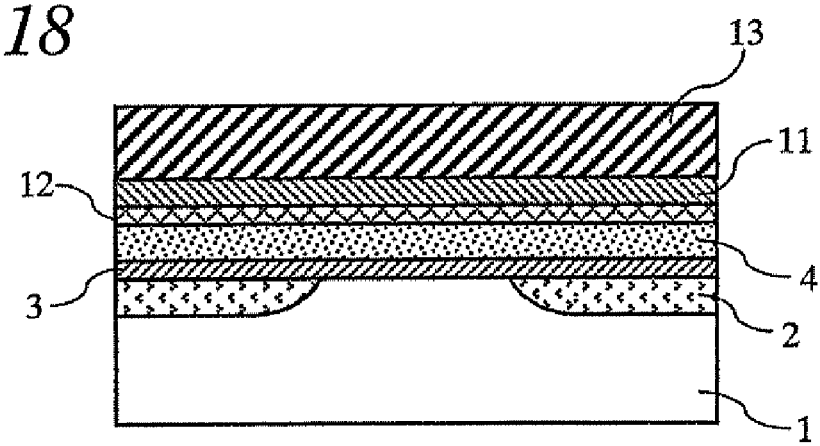
FIG. 18 shows a method of manufacturing a semiconductor device according to the third embodiment.

Next, a tungsten layer 13 is formed on the tungsten nitride layer 11 by a sputtering or CVD method to provide a structure shown in FIG. 18.

After the formation of the tungsten layer according to the above-stated steps, subsequent steps are performed in the same manner as those procedures shown in FIGS. 7 to 19 as illustrated with respect to the first embodiment. More particularly, a hard mask is formed on the tungsten layer and patterned according to a lithographic method. Next, using the hard mask, the underlying tungsten layer, tungsten nitride layer, tungsten silicon nitride layer, polysilicon layer and gate insulating film are, respectively, etched in a desired pattern. Finally, after formation of a silicon oxide film, a silicon nitride film or a composite film of silicon oxide and silicon nitride films, the film is etched back to form side walls.

According to the steps set forth hereinabove, the gate electrode can be formed on the semiconductor substrate. More particularly, this embodiment is characterized in that the electrode formed on the semiconductor substrate has the polysilicon layer, the tungsten silicon nitride layer formed on the polysilicon layer and serving as an intermediate layer, the tungsten nitride layer formed on the tungsten silicon nitride layer, and the tungsten layer formed on the tungsten nitride layer.

Figure 19:
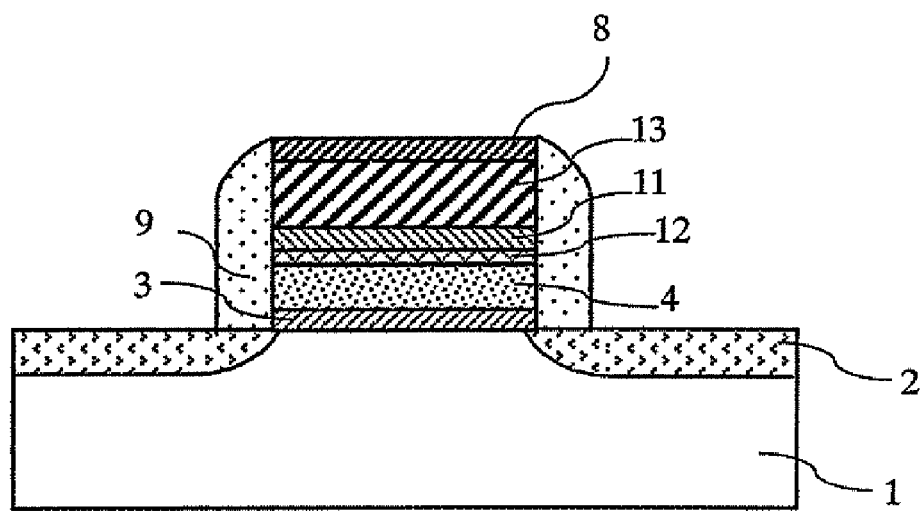
FIG. 19 shows a method of manufacturing a semiconductor device according to the third embodiment.

FIG. 19 is a sectional view of the gate electrode formed according to this embodiment. In FIG. 19, indicated by 1 is a semiconductor substrate, by 2 is a diffusion layer, by 3 is a gate insulating film, by 4 is a polysilicon layer, by 8 is a hard mask, by 9 is a side wall, by 11 is a tungsten nitride layer, by 12 is a tungsten silicon nitride layer, and by 13 is a tungsten layer.

According to the embodiment, the tungsten silicon nitride layer is formed, as an intermediate layer, between the polysilicon layer and the tungsten nitride layer, so that any high resistance layer is not formed through the reaction between the polysilicon layer and the tungsten nitride layer when high heating temperatures are applied thereto.

Further, the tungsten silicon nitride layer is conductive in nature, so that good ohmic contact can be obtained according to this embodiment.

Fourth Embodiment

This embodiment is characterized in that a tungsten silicon nitride layer is formed, as an intermediate layer, between a polysilicon layer and a tungsten nitride layer.

According to the procedures of FIG. 1 to 3 illustrated with respect to the first embodiment, a semiconductor device is made. More particularly, after formation of a diffusion layer in a semiconductor substrate, a gate insulating film and a polysilicon layer are successively formed on the semiconductor substrate.

The polysilicon layer can be formed by direct formation of the polysilicon layer on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 20:
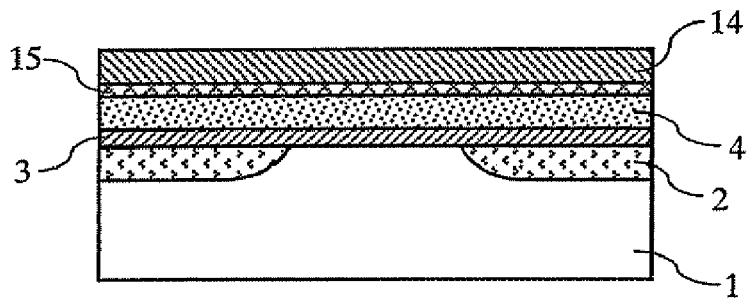
FIG. 20 shows a method of manufacturing a semiconductor device according to the fourth embodiment.

Next, a tungsten nitride layer is formed on the polysilicon layer according to a sputtering or CVD method. This embodiment is characterized in that the temperature for the formation of the tungsten nitride layer is as high as 300° C. to 700° C., preferably 350° C. to 500° C. This permits, as shown in FIG. 20, a tungsten nitride layer 14 to be formed on the polysilicon layer 4 and a tungsten silicon nitride layer 15 to be formed in the vicinity of the interface between the polysilicon layer 4 and the tungsten nitride layer 14. It will be noted that in FIG. 20, films corresponding to those films illustrated in the first embodiment are, respectively, indicated by like reference numerals.

In the arrangement of the present embodiment, the tungsten silicon nitride layer acts as a barrier between the polysilicon layer and the tungsten nitride layer, so that the formation of a high resistance layer can be prevented, thereby forming a gate electrode ensuring good ohmic contact.

In this embodiment, after the formation of the tungsten nitride layer and the tungsten silicon nitride layer, thermal treatment in an atmosphere of nitrogen ($N_2$) or ammonia ($NH_3$) gas may be carried out. The thermal treating temperature should preferably range from 600° C. to 1,200° C., more preferably from 800° C. to 1,000° C. Such a thermal treatment allows the crystallization of the tungsten nitride layer to proceed. It is to be noted that if the thermal treatment is carried out in an atmosphere of ammonia gas, a thermal treatment in an atmosphere of nitrogen may be subsequently performed in order to remove residual ammonia.

Figure 21:
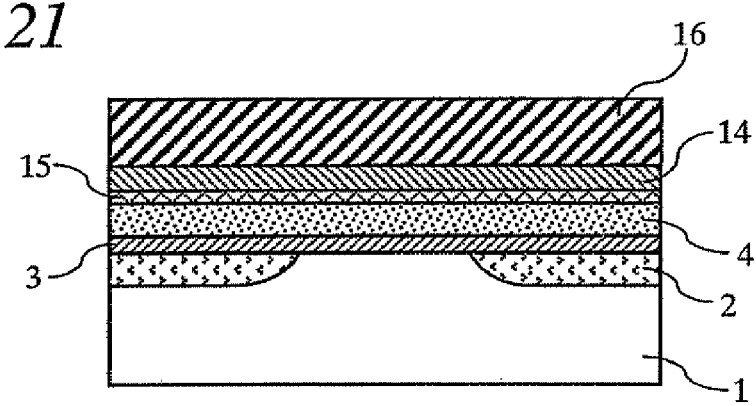
FIG. 21 shows a method of manufacturing a semiconductor device according to the fourth embodiment.

Next, a tungsten layer 16 is formed on the tungsten nitride layer 14 by a sputtering or CVD method to provide a structure shown in FIG. 21.

After the formation of the tungsten layer according to the above step, subsequent steps are carried out in the same manner as in FIGS. 7 to 10 illustrated with respect to the first embodiment. More particularly, a hard mask is formed on the tungsten layer and subjected to patterning by a photolithographic method. Next, the underlying tungsten layer, tungsten nitride layer, tungsten silicon nitride layer, polysilicon and gate insulating film are, respectively, etched in a desired pattern. Finally, after formation of a silicon oxide film, a silicon nitride film or a composite film of silicon oxide and silicon nitride films, the film is etched back to form side walls.

According to the steps set forth hereinabove, the gate electrode can be formed on the semiconductor substrate. More particularly, this embodiment is characterized in that the electrode formed on the semiconductor substrate has the polysilicon layer, the tungsten silicon nitride layer formed on the polysilicon layer and serving as an intermediate layer, the tungsten nitride layer formed on the tungsten silicon nitride layer, and the tungsten layer formed on the tungsten nitride layer.

Figure 22:
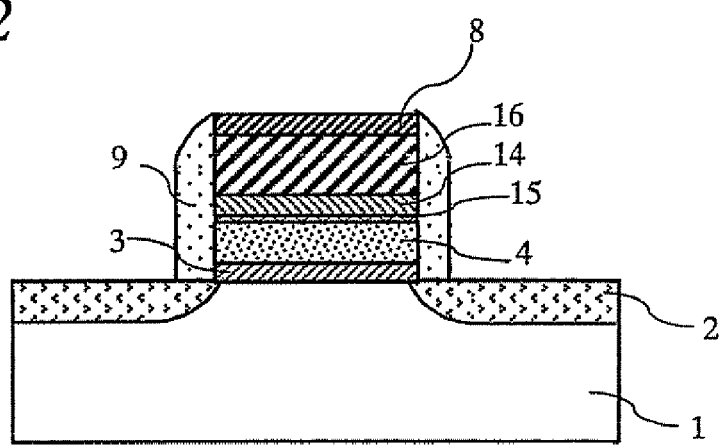
FIG. 22 shows a method of manufacturing a semiconductor device according to the fourth embodiment.

FIG. 22 is a sectional view of the gate electrode formed according to this embodiment. In FIG. 22, indicated by 1 is a semiconductor substrate, by 2 is a diffusion layer, by 3 is a gate insulating film, by 4 is a polysilicon layer, by 8 is a hard mask, by 9 is a side wall, by 14 is a tungsten nitride layer, by 15 is a tungsten silicon nitride layer, and by 16 is a tungsten layer.

According to the embodiment, the tungsten silicon nitride layer is formed, as an intermediate layer, between the polysilicon layer and the tungsten nitride layer, so that any high resistance layer is not formed through the reaction between the polysilicon layer and the tungsten nitride layer when high heating temperatures are applied thereto.

Further, the tungsten silicon nitride layer is conductive in nature, so that good ohmic contact can be obtained according to the embodiment.

Fifth Embodiment

This embodiment is characterized in that a silicon germanium layer is formed, as an intermediate layer, between a polysilicon layer and a tungsten nitride layer.

According to the procedures of FIGS. 1 to 3 illustrated with respect to the first embodiment, a diffusion layer is formed in a semiconductor substrate, after which a gate insulating film and a polysilicon layer are successively formed.

The polysilicon layer can be formed by direct formation of the polysilicon layer on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 23:
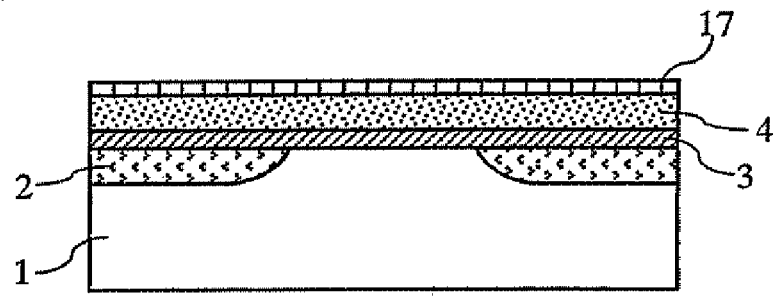
FIG. 23 shows a method of manufacturing a semiconductor device according to the fifth embodiment.
Figure 24:
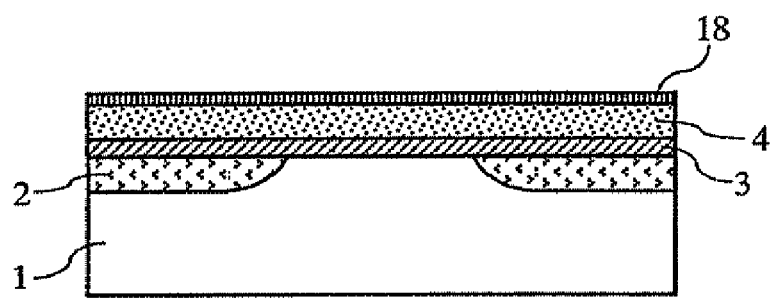
FIG. 24 shows a method of manufacturing a semiconductor device according to the fifth embodiment.

In this embodiment, as shown in FIG. 23, a germanium (Ge) layer 17 is formed on the polysilicon layer 4 by a sputtering or CVD method. Next, thermal treatment in an atmosphere of nitrogen or ammonia gas is carried out. If thermal treatment in an atmosphere of ammonia gas is performed, then a thermal treatment in an atmosphere of nitrogen gas may be subsequently carried out in order to remove residual ammonia. The thermal treatment temperature should preferably range from 600° C. to 1,200° C., more preferably from 800° C. to 1,000° C. Such a thermal treatment as set out above permits the germanium layer on the polysilicon layer 4 to be converted into a silicon germanium ($Si_xGe_y$) layer 18 as is particularly shown in FIG. 24. It will be noted that in FIGS. 23, 24, films corresponding to those films illustrated in the first embodiment are, respectively, indicated by like reference numerals.

In this embodiment, it is preferred that after the formation of the germanium film, thermal treatment is continuously carried out without exposure of the semiconductor substrate to air. For instance, using a multi-chamber device, the substrate is transferred to a thermal treatment device in vacuum or in an atmosphere of an inert gas after the formation of the germanium film. This can eventually prevent the surface of the germanium layer from being exposed to air and oxidized.

Figure 25:
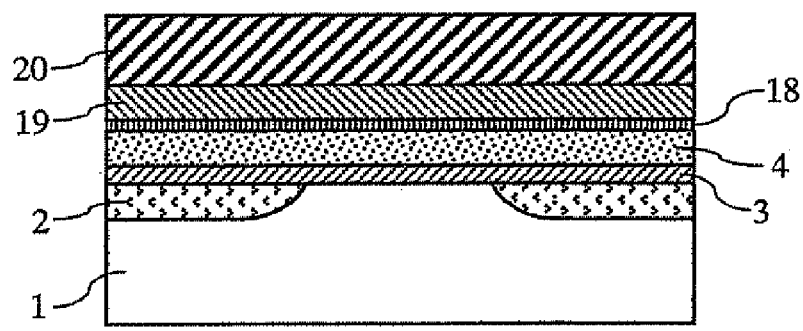
FIG. 25 shows a method of manufacturing a semiconductor device according to the fifth embodiment.

Next, a tungsten nitride layer 19 and a tungsten layer 20 are successively formed on the silicon germanium layer 18 by a sputtering or CVD method to provide a structure shown in FIG. 25.

Subsequent steps are carried out in the same manner as in FIGS. 7 to 10 illustrated with respect to the first embodiment. More particularly, a hard mask is formed on the tungsten layer and patterned by a photolithographic method. Next, the underlying tungsten layer, tungsten nitride layer, silicon germanium layer, polysilicon layer and gate insulating film are, respectively, etched in a desired pattern. Finally, a silicon oxide film, a silicon nitride film or a composite film of silicon oxide and silicon nitride films is formed and etched back on the entire surface thereof to form side walls.

According to the steps set out hereinabove, the gate electrode can be formed on the semiconductor substrate. More particularly, this embodiment is characterized in that the electrode formed on the semiconductor substrate includes the polysilicon layer, the silicon germanium layer serving as an intermediate layer and formed on the polysilicon layer, the tungsten nitride layer formed on the silicon germanium layer, and the tungsten layer formed on the tungsten nitride layer.

Figure 26:
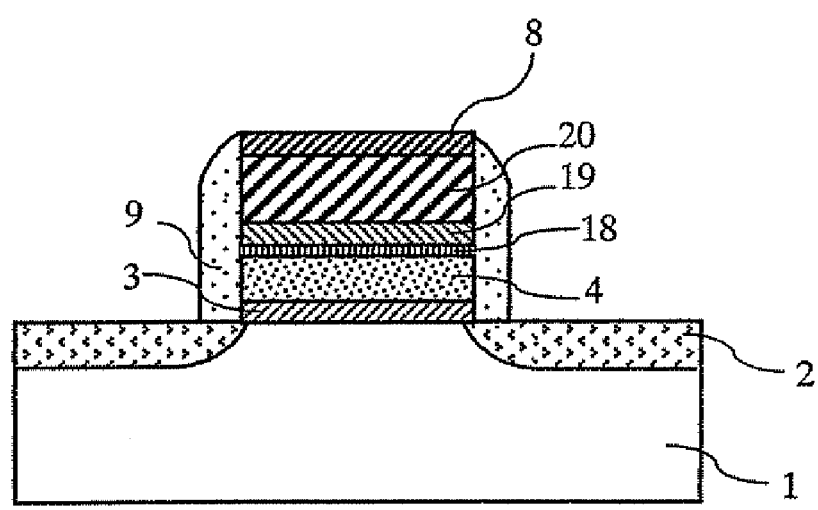
FIG. 26 shows a method of manufacturing a semiconductor device according to the fifth embodiment.

FIG. 26 is a sectional view of the gate electrode formed according to this embodiment. In FIG. 26, indicated by 1 is a semiconductor substrate, by 2 is a diffusion layer, by 3 is a gate insulating film, by 4 is a polysilicon layer, by 8 is a hard mask, by 9 is a side wall, by 18 is a silicon germanium layer, by 19 is a tungsten nitride layer, and by 20 is a tungsten layer.

According to the embodiment, the silicon germanium layer is formed, as an intermediate layer, between the polysilicon layer and the tungsten nitride layer, so that any high resistance layer is not formed between the polysilicon layer and the tungsten nitride layer when high heating temperatures are applied thereto. Moreover, since the silicon germanium layer is conductive in nature, good ohmic contact is ensured.

Sixth Embodiment

This embodiment is characterized in that a silicon germanium layer is formed, as an intermediate layer, between a polysilicon layer and a tungsten nitride layer.

According to the procedures of FIGS. 1 to 3 illustrated with respect to the first embodiment, a diffusion layer is formed in a semiconductor substrate, after which a gate insulating film and a polysilicon layer are successively formed.

The polysilicon layer can be formed by direct formation of the polysilicon layer on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 27:
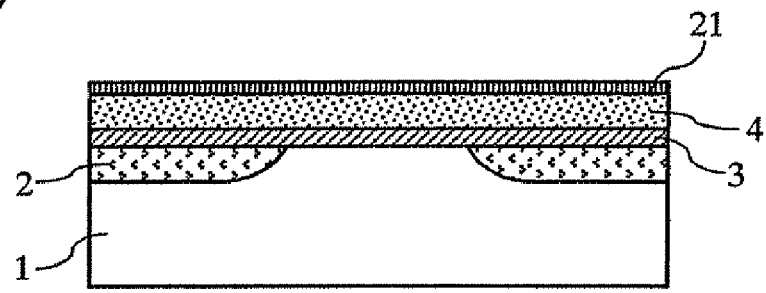
FIG. 27 shows a method of manufacturing a semiconductor device according to the sixth embodiment.

This embodiment is characterized in that, as shown in FIG. 27, a silicon germanium ($Si_xGe_y$) layer 21 is formed on the polysilicon layer 4 by a sputtering or CVD method. It will be noted that in FIG. 27, films corresponding to those films illustrated in the first embodiment are, respectively, indicated by like reference numerals.

After formation of the silicon germanium layer, thermal treatment in an atmosphere of nitrogen or ammonia gas may be carried out. The thermal treatment temperature should preferably range from 600° C. to 1,200° C., more preferably from 800° C. to 1,000° C. It will be noted that if thermal treatment in an atmosphere of ammonia gas is performed, then a thermal treatment in an atmosphere of nitrogen gas may be subsequently carried out in order to remove residual ammonia.

Where thermal treatment is carried out, it is preferred that after the formation of the silicon germanium film, the semiconductor substrate is continuously placed in a thermal treatment device without exposure to air. For instance, using a multi-chamber device, the substrate is transferred to a thermal treatment device in vacuum or in an atmosphere of an inert gas after the formation of the silicon germanium film. This can eventually prevent the surface of the germanium layer from being exposed to air and oxidized.

Figure 28:
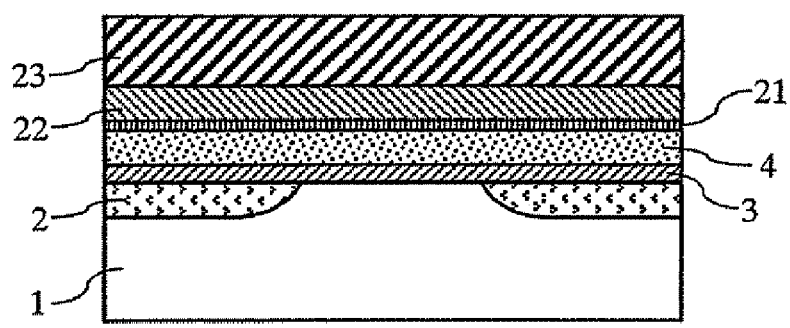
FIG. 28 shows a method of manufacturing a semiconductor device according to the sixth embodiment.

Next, a tungsten nitride layer 22 and a tungsten layer 23 are successively formed on the silicon germanium layer 21 by a sputtering or CVD method to provide a structure shown in FIG. 28.

Subsequent steps are carried out in the same manner as in FIGS. 7 to 10 illustrated with respect to the first embodiment. More particularly, a hard mask is formed on the tungsten layer and patterned by a photolithographic method. Next, the underlying tungsten layer, tungsten nitride layer, silicon germanium layer, polysilicon layer and gate insulating film are, respectively, etched in a desired pattern. Finally, a silicon oxide film, a silicon nitride film or a composite film of silicon oxide and silicon nitride films is formed and etched back on the entire surface thereof to form side walls.

According to the steps set out hereinabove, the gate electrode can be formed on the semiconductor substrate. More particularly, this embodiment is characterized in that the electrode formed on the semiconductor substrate includes the polysilicon layer, the silicon germanium layer serving as an intermediate layer and formed on the polysilicon layer, the tungsten nitride layer formed on the silicon germanium layer, and the tungsten layer formed on the tungsten nitride layer.

Figure 29:
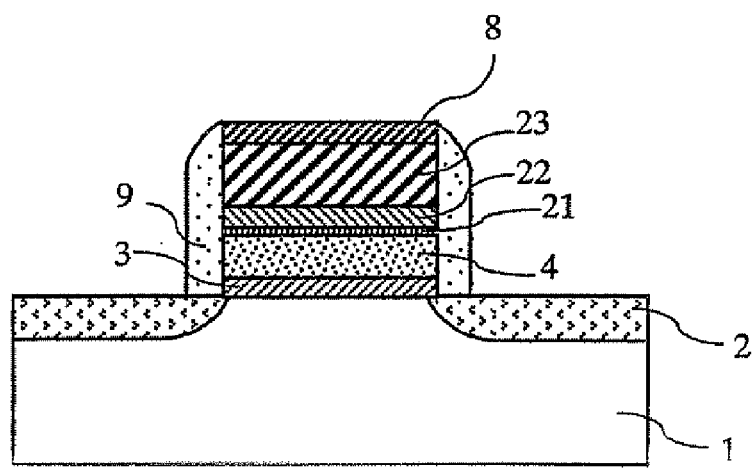
FIG. 29 shows a method of manufacturing a semiconductor device according to the sixth embodiment.

FIG. 29 is a sectional view of the gate electrode formed according to this embodiment. In FIG. 29, indicated by 1 is a semiconductor substrate, by 2 is a diffusion layer, by 3 is a gate insulating film, by 4 is a polysilicon layer, by 8 is a hard mask, by 9 is a side wall, by 21 is a silicon germanium layer, by 22 is a tungsten nitride layer, and by 23 is a tungsten layer.

According to the embodiment, the silicon germanium layer is formed, as an intermediate layer, between the polysilicon layer and the tungsten nitride layer, so that any high resistance layer is not formed between the polysilicon layer and the tungsten nitride layer when high heating temperatures are applied thereto. Moreover, since the silicon germanium layer is conductive in nature, good ohmic contact is ensured.

Seventh Embodiment

This embodiment is characterized in that a silicon germanium layer is formed, as an intermediate layer, between a polysilicon layer and a tungsten nitride layer.

According to the procedures of FIGS. 1 to 3 illustrated with respect to the first embodiment, a semiconductor device is made. More particularly, a diffusion layer is formed in a semiconductor substrate, after which a gate insulating film and a polysilicon layer are successively formed on the semiconductor substrate.

The polysilicon layer can be formed by direct formation of the polysilicon layer on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 30:
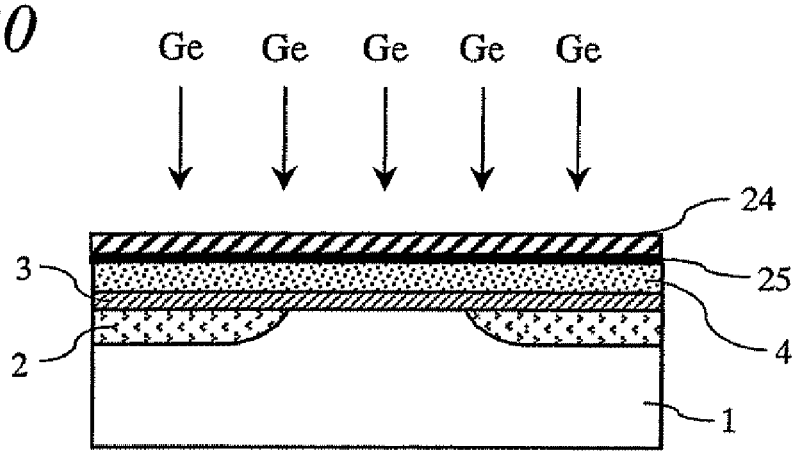
FIG. 30 shows a method of manufacturing a semiconductor device according to the seventh embodiment.

Next, as shown in FIG. 30, a tungsten layer 24 is formed on the polysilicon layer 4 by a sputtering or CVD method, after which germanium (Ge) is injected from above the tungsten layer 24. This permits a germanium-injected layer 25 to be formed between the polysilicon layer 4 and the tungsten layer 24. The injection of the germanium may be carried out, for example, by an ion implantation method. It will be noted that in FIG. 30, films corresponding to those films illustrated in the first embodiment are, respectively, indicated by like reference numerals.

Germanium is injected from above the tungsten layer 24, i.e., from the main surface side of the tungsten layer 24. In this embodiment, after the formation of the tungsten layer 24, germanium is charged into from outside via the tungsten layer 24 as shown in FIG. 30 to form the germanium injected layer 25 between the polysilicon layer 4 and the tungsten layer 24.

Next, thermal treatment in an atmosphere of nitrogen or ammonia gas is carried out. The thermal treatment temperature should preferably range from 600° C. to 1,200° C., more preferably from 800° C. to 1,000° C. It will be noted that if thermal treatment in an atmosphere of ammonia gas is performed, then a thermal treatment in an atmosphere of nitrogen gas may be subsequently carried out in order to remove residual ammonia.

Figure 31:
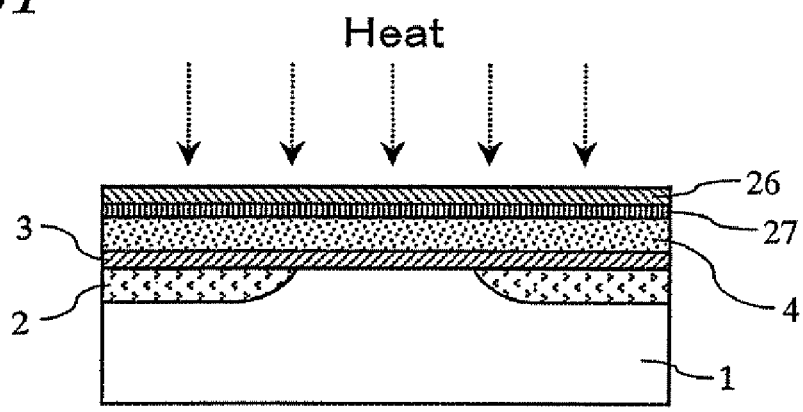
FIG. 31 shows a method of manufacturing a semiconductor device according to the seventh embodiment.

FIG. 31 is a sectional view of the semiconductor device obtained after thermal treatment. In FIG. 31, films corresponding to those films illustrated in the first embodiment are, respectively, indicated by like reference numerals. As shown in the figure, the thermal treatment enables one to convert the tungsten (W) layer into a tungsten nitride (WN) layer 26 and the germanium injected layer into a silicon germanium layer 27. More particularly, the tungsten nitride layer 26 is formed on the polysilicon layer 4 through the silicon germanium layer 27. In this arrangement, the silicon germanium layer 27 serves as a barrier layer, under which when high heating temperatures are applied to the polysilicon layer 4 and the tungsten nitride layer 265, no high resistance layer is formed through reaction therebetween.

In this embodiment, it is preferred that after the formation of the tungsten layer, thermal treatment is carried out continuously without exposure of the semiconductor layer to air. For instance, using a multi-chamber device, the substrate is transferred to a thermal treatment device in vacuum or in an atmosphere of an inert gas after the formation of the tungsten layer. This eventually prevents the surface of the tungsten layer from exposure to air. In this manner, any oxide film is not formed on the surface of the tungsten layer, so that the rise in resistance value of the semiconductor device can be prevented.

Figure 32:
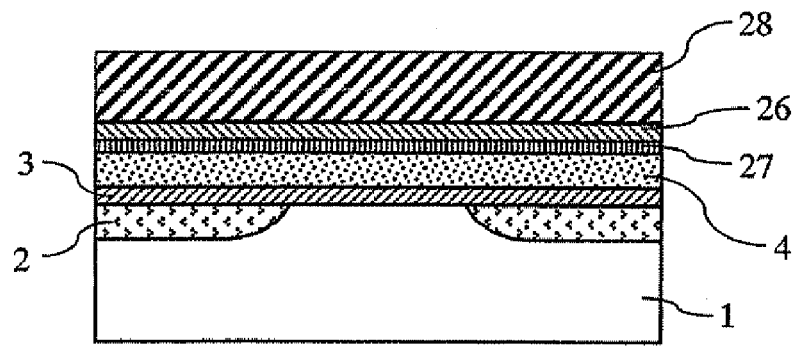
FIG. 32 shows a method of manufacturing a semiconductor device according to the seventh embodiment.

Next, a tungsten layer 28 is formed on the tungsten nitride layer 26 by a puttering or CVD method to provide a structure shown in FIG. 32. In FIG. 32, films corresponding to those films illustrated in the first embodiment are, respectively, indicated by like reference numerals.

After the formation of the tungsten layer according to the steps set out hereinabove, subsequent steps are carried out in the same manner as the procedures shown in FIGS. 7 to 10 illustrated with respect to the first embodiment. More particularly, a hard mask is formed on the tungsten layer and patterned by a photolithographic method. Thereafter, the underlying tungsten layer, tungsten nitride layer, silicon germanium layer, polysilicon layer and gate insulating film are, respectively, etched in a desired pattern. Finally, a silicon oxide film, a silicon nitride film or a composite film of silicon oxide and silicon nitride films is formed thereover, followed by etching back to form side walls.

According to the steps set out hereinabove, the gate electrode can be formed on the semiconductor substrate. More particularly, this embodiment is characterized in that the electrode formed on the semiconductor substrate includes the polysilicon layer, the silicon germanium layer serving as an intermediate layer and formed on the polysilicon layer, the tungsten nitride layer formed on the silicon germanium layer, and the tungsten layer formed on the tungsten nitride layer.

Figure 33:
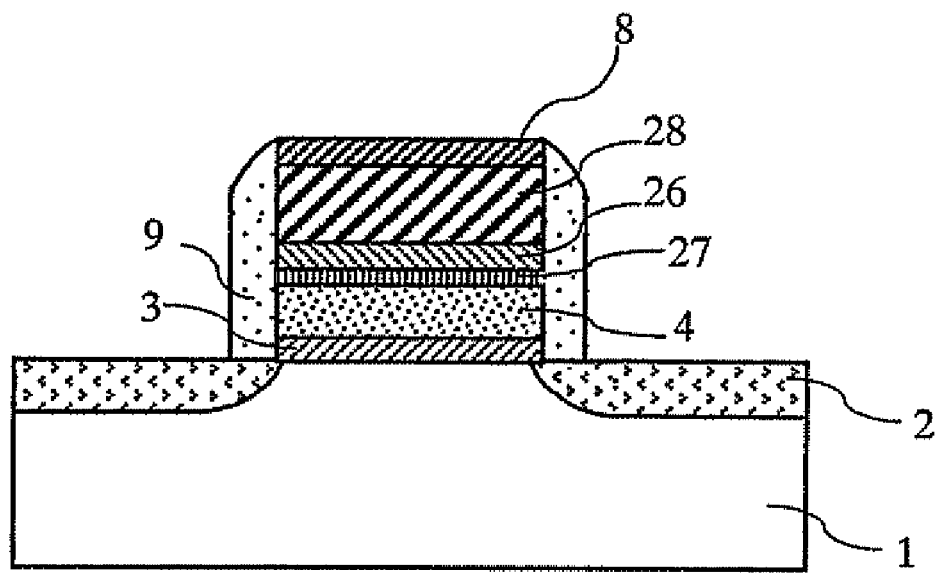
FIG. 33 shows a method of manufacturing a semiconductor device according to the seventh embodiment.

FIG. 33 is a sectional view of the gate electrode formed according to this embodiment. In FIG. 33, indicated by 1 is a semiconductor substrate, by 2 is a diffusion layer, by 3 is a gate insulating film, by 4 is a polysilicon layer, by 8 is a hard mask, by 9 is a side wall, by 26 is a tungsten nitride layer, by 27 is a silicon germanium layer, and by 28 is a tungsten layer.

According to the embodiment, the silicon germanium layer is formed, as an intermediate layer, between the polysilicon layer and the tungsten nitride layer, so that any high resistance layer is not formed between the polysilicon layer and the tungsten nitride layer when high heating temperatures are applied thereto.

Moreover, since the tungsten silicon nitride layer is conductive in nature, good ohmic contact is ensured.

Eighth Embodiment

This embodiment is characterized in that a silicon germanium layer is formed, as an intermediate layer, between a polysilicon layer and a tungsten nitride layer.

According to the procedures of FIGS. 1 to 4 illustrated with respect to the first embodiment, a semiconductor device is made. More particularly, a diffusion layer is formed in a semiconductor substrate, after which a gate insulating film, a polysilicon layer and a tungsten nitride layer are successively formed on the semiconductor substrate.

The polysilicon layer can be formed by direct formation of the polysilicon layer on the gate insulating film. In order to enhance the crystallinity of the polysilicon layer, it is preferred to subject the layer to thermal treatment under appropriate conditions (of about 750° C., for example). Alternatively, the polysilicon layer may be formed by forming a doped amorphous silicon layer on the gate insulating film, after which the amorphous silicon layer is thermally treated to form a polysilicon layer. More particularly, when the thermal treatment is carried out at a temperature of about 750° C., the crystal structure of the amorphous silicon layer can be changed to provide a polysilicon layer.

Figure 34:
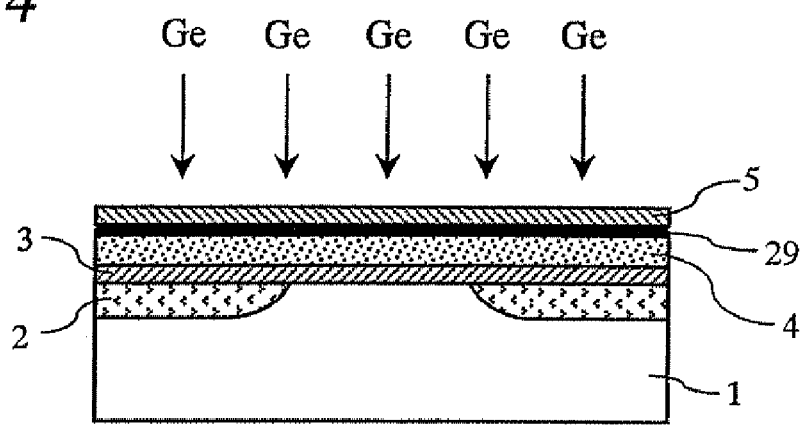
FIG. 34 shows a method of manufacturing a semiconductor device according to the eighth embodiment.
Figure 35:
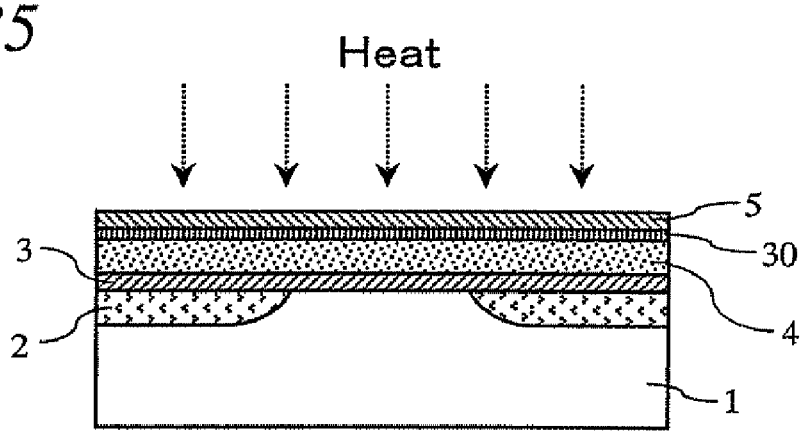
FIG. 35 shows a method of manufacturing a semiconductor device according to the eighth embodiment.

Next, as shown in FIG. 34, germanium is injected from above the tungsten nitride layer 5 to form a germanium-injected layer 29 between the polysilicon layer 4 and the silicon nitride layer 5. Subsequently, thermal treatment in an atmosphere of nitrogen or ammonia gas is carried out to convert the germanium-injected layer into a silicon germanium layer 30 as shown in FIG. 35. In FIGS. 34 and 35, films corresponding to those films illustrated in the first embodiment are, respectively, indicated by like reference numerals.

The thermal treatment temperature should preferably range from 600° C. to 1,200° C., more preferably from 800° C. to 1,000° C. If thermal treatment in an atmosphere of ammonia gas is performed, then a thermal treatment in an atmosphere of nitrogen gas may be subsequently carried out in order to remove residual ammonia.

This arrangement is advantageous in that the silicon germanium layer serves as a barrier layer and is able to suppress the reaction between the polysilicon layer 4 and the tungsten nitride layer 5. Thus, when high heating temperatures are applied to the polysilicon layer 4 and the tungsten nitride layer 5 during the course of the process, it is prevented to form a resistance layer between these films.

Moreover, the silicon germanium layer 30 is conductive in nature, so that it becomes possible form a gate electrode having a good ohmic contact.

Figure 36:
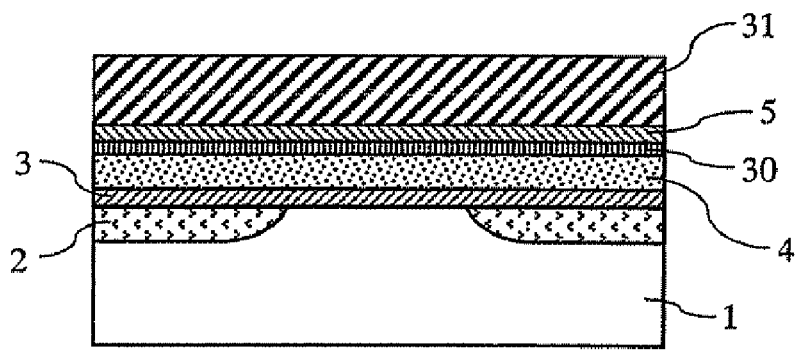
FIG. 36 shows a method of manufacturing a semiconductor device according to the eighth embodiment.

Next, as shown in FIG. 36, a tungsten layer 31 is formed on the tungsten nitride 5 by a CVD or sputtering method.

Thereafter, subsequent steps are carried out in the same manner as in FIGS. 7 to 10 illustrated with respect to the first embodiment. More particularly, a hard mask is formed on the tungsten layer and patterned by a photolithographic method. Thereafter, the underlying tungsten layer, tungsten nitride layer, silicon germanium layer, polysilicon layer and gate insulating film are, respectively, etched in a desired pattern. Finally, a silicon oxide film, a silicon nitride film or a composite film of silicon oxide and silicon nitride films is formed thereover, followed by etching back to form side walls.

According to the steps set out hereinabove, the gate electrode can be formed on the semiconductor substrate. More particularly, this embodiment is characterized in that the electrode formed on the semiconductor substrate includes the polysilicon layer, the silicon germanium layer serving as an intermediate layer and formed on the polysilicon layer, the tungsten nitride layer formed on the silicon germanium layer, and the tungsten layer formed on the tungsten nitride layer.

Figure 37:
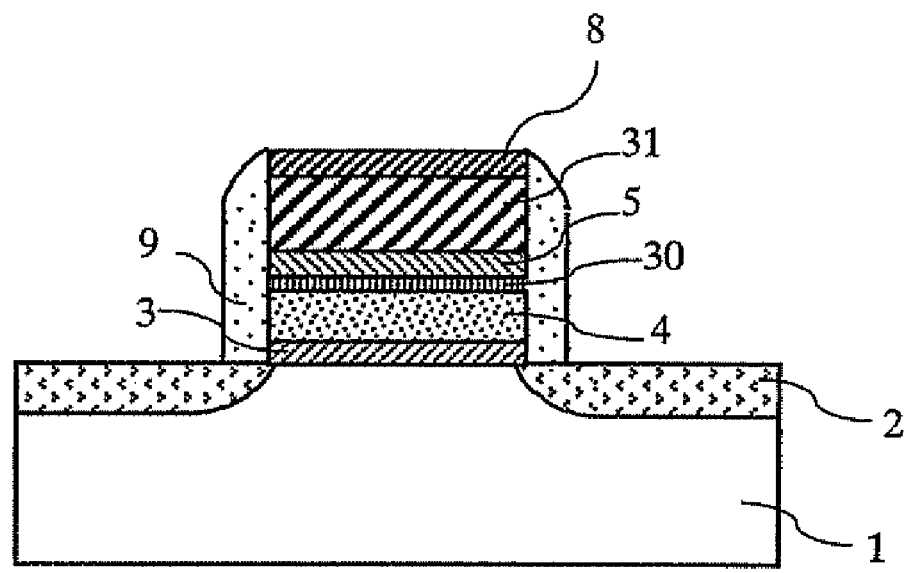
FIG. 37 shows a method of manufacturing a semiconductor device according to the eighth embodiment.

FIG. 37 is a sectional view of the gate electrode formed according to this embodiment. In FIG. 37, indicated by 1 is a semiconductor substrate, by 2 is a diffusion layer, by 3 is a gate insulating film, by 4 is a polysilicon layer, by 5 is a tungsten nitride layer, by 8 is a hard mask, by 9 is a side wall, by 30 is a silicon germanium layer, and by 31 is a tungsten layer.

According to the embodiment, the silicon germanium layer is formed, as an intermediate layer, between the polysilicon layer and the tungsten nitride layer, so that any high resistance layer is not formed between the polysilicon layer and the tungsten nitride layer when high heating temperatures are applied thereto. Moreover, since the silicon germanium layer is conductive in nature, good ohmic contact is ensured.

As will be apparent from the foregoing, an intermediate layer is formed between a polysilicon layer and a tungsten nitride layer according to the invention, so that when high heating temperatures are applied thereof, any high resistance layer is not formed between the polysilicon layer and the tungsten nitride layer.

According to the invention, a conductive layer is used as the intermediate layer, and thus a gate electrode ensuring good ohmic contact can be formed.

Moreover, according to the invention, because tungsten silicon nitride layer is formed between a polysilicon layer and a tungsten layer, the reaction between the polysilicon layer and the tungsten layer can be suppressed, thereby providing a semiconductor device of low resistance.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-359920, filed on Dec. 11, 2002 including specification, claims, drawings and summary, on which the Convention priority of the present application is based, are incorporated herein by reference in its entirety.

What is claimed is:

1. A method of manufacturing a semiconductor device comprising:
   forming a gate insulating film on a semiconductor substrate;
   forming a polysilicon layer on said gate insulating film;
   forming a tungsten layer on said polysilicon layer;
   implanting germanium into said tungsten layer to form a germanium-implanted layer between said polysilicon layer and said tungsten layer;
   thermally treating said tungsten layer and said germanium-implanted layer in an ambient of one of nitrogen and ammonia to convert said tungsten layer into a tungsten nitride layer and said germanium-implanted layer into a silicon-germanium layer; and
   forming a tungsten layer on said tungsten nitride layer.

* * * * *